United States Patent [19]

Weeks et al.

[11] Patent Number: 5,703,493

[45] Date of Patent: Dec. 30, 1997

[54] WAFER HOLDER FOR SEMICONDUCTOR APPLICATIONS

[75] Inventors: Anthony R. Weeks, Gilbert; Mark D. Norris, Mesa; Steven A. Switzer, Phoenix, all of Ariz.

[73] Assignee: Motorola, Inc., Schaumburg, Ill.

[21] Appl. No.: 548,109

[22] Filed: Oct. 25, 1995

[51] Int. Cl.$^6$ .................................................. G01R 1/04
[52] U.S. Cl. .................................... 324/755; 324/765
[58] Field of Search ...................... 324/72.5, 158.1, 324/73.1, 754, 758, 537, 755, 760, 765; 269/21, 55; 437/8; 257/40, 48

[56] References Cited

U.S. PATENT DOCUMENTS

| | | | |
|---|---|---|---|
| 3,729,206 | 4/1973 | Cachon et al. | 269/21 |
| 3,936,743 | 2/1976 | Roch | 324/537 |
| 3,949,295 | 4/1976 | Moorshead | 324/760 |
| 4,066,943 | 1/1978 | Roch | 269/55 |
| 4,213,698 | 7/1980 | Firtion et al. | 269/21 |
| 4,955,590 | 9/1990 | Narushima et al. | 269/21 |
| 5,479,108 | 12/1995 | Cheng | 324/765 |

*Primary Examiner*—Vinh P. Nguyen
*Attorney, Agent, or Firm*—Bruce T. Neel

[57] ABSTRACT

A semiconductor substrate (15) is placed into a recessed area (12) of a support structure (10). A ring (20) is then placed on the support structure (10) to form a wafer holder (30) which provides support to the semiconductor substrate (15) during handling, transporting, or electrical testing operations. The recessed area (12) can also have a vacuum opening (13) and a vacuum groove (17) so a vacuum pressure can be applied to the backside of semiconductor substrate (15). This will correct for any warpage or bowing in the semiconductor substrate (15) so a planar surface is formed for the electrical testing operation. The wafer holder (30) also has a flat (16) so the wafer holder (30) can be aligned and processed like a wafer with a diameter larger than the semiconductor substrate (15).

17 Claims, 2 Drawing Sheets

WAFER HOLDER FOR SEMICONDUCTOR APPLICATIONS

BACKGROUND OF THE INVENTION

The present invention relates, in general, to semiconductor devices, and more particularly, to an apparatus for processing thin semiconductor substrates.

In an effort to improve the performance of semiconductor devices, it is very advantageous to form the semiconductor device in a semiconductor substrate that is as thin as possible. Traditional silicon substrates are poor conductors of heat, therefore by thinning the semiconductor substrate, the heat dissipation of the semiconductor device is significantly improved. Thin substrates also improve the "on" resistance, $R_{ds}$, of vertical Metal Oxide Semiconductor Field Effect Transistors (MOSFETs) by reducing the width of the channel region between the source and the drain.

Traditional methods for thinning semiconductor use a chemical and mechanical polishing technique that can thin a substrate down to 25 µm (1 mil) to 250 µm (10 mils). A substrate with this thickness, however, becomes extremely fragile and requires delicate handling to prevent the substrate from breaking. Thin substrates also warp very easily which makes processing steps that require a planar surface more complicated. A typical 75 mm (three inch) wafer with a thickness of 125 µm (5 mils) can exhibit warpage of as much as 150 µm (6 mils) which is approximately 150 microns. This height variation can result in insufficient contact of probe needles during electrical testing of semiconductor devices on the wafer.

Accordingly, it would be advantageous to have an apparatus for the transporting and processing of thin semiconductor substrates. It would be of further advantage if the apparatus could be used in conjunction with handling procedures used to transport traditional wafers with a bulk thickness. It would be of even further advantage if the apparatus could be used to apply a voltage potential to a portion of the semiconductor substrates during electrical testing.

DETAILED DESCRIPTION OF THE DRAWINGS

Figure 1:
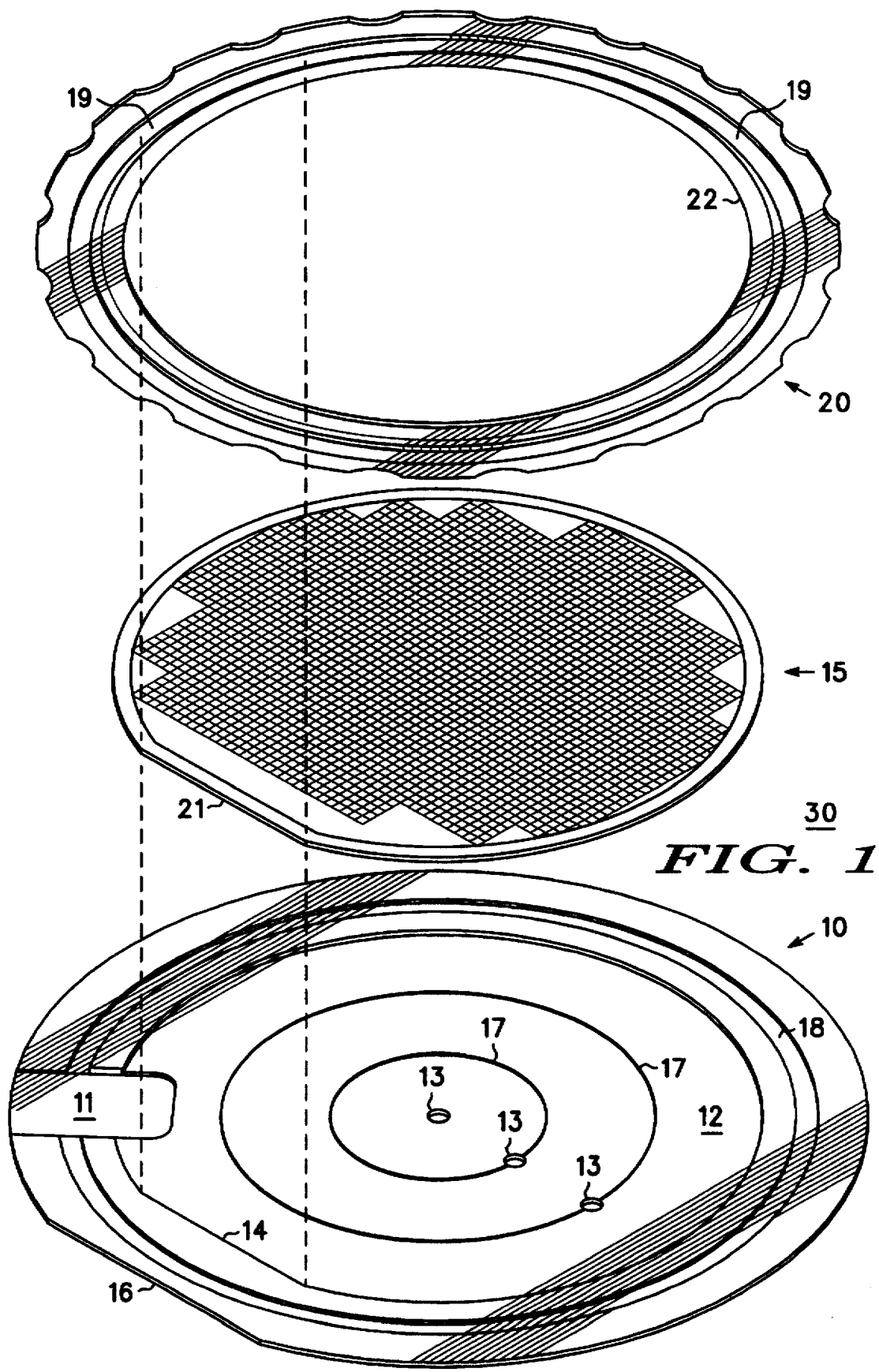
FIG. 1 is an enlarged isometric view of an apparatus according to the present invention.

FIG. 1 is an enlarged isometric view of an apparatus, semiconductor wafer holder, or wafer holder 30 according to the present invention. Wafer holder 30 comprises a support structure 10 used in conjunction with a ring 20 to hold a semiconductor substrate 15 in place during portions of the fabrication and assembly process. Wafer holder 30 can be formed to fit any semiconductor substrate 15 used in the industry. It is especially effective for providing support to semiconductor substrates 15 that are 25 µm (1 mil) to 250 µm (10 mils) thick.

Support structure 10 for example, can be fabricated from a material that is electrically conductive such as aluminum, aluminum alloy, nickel, platinum, stainless steel, titanium, copper, or gold. It is also possible to form support structure 10 from a non-conductive material such as quartz, "Delrin", or "Teflon". "Delrin" and "Teflon" are polymer compounds used regularly in the semiconductor industry and are registered trademarks of E. I. Du Pont De Nemours and Company of Wilmington, Del. It is also possible to plate a portion of support structure 10 using one of the above mentioned materials. Ring 20 exposes at least a central portion of semiconductor substrate 15 and is preferably formed from either "Delrin" or "Teflon".

Support structure 10 can be formed to have a patterned surface with a vacuum wand slot 11 and a recessed area 12. Vacuum wand (not shown) slot 11 allows a vacuum wand to be used to place semiconductor substrate 15 into support structure 10 and then retract the vacuum wand from recessed area 12. Recessed area 12 can be further detailed to have an alignment flat 14, at least one vacuum opening 13, and at least one vacuum groove 17. Alignment flat 14 can be used to align a flat 21 of semiconductor substrate 15 to the alignment flat 14 of support structure 10. When semiconductor substrate 15 is in support structure 10, a vacuum pressure can be applied to the backside of semiconductor substrate 15 through vacuum openings 13 and vacuum grooves 17. This will correct for any warpage caused by the prior processing semiconductor substrate 15 or due to the flexibility of semiconductor substrate 15.

Once semiconductor substrate 15 is properly placed in support structure 10, a ring tab 19 of ring 20 is placed into a ring groove 18 to hold ring 20 in place. Ring groove 18 is formed in wafer holder 10 outside of recessed 5 area 12. Ring 20 is formed such that an inner edge 22 will contact semiconductor substrate 15 and firmly hold semiconductor substrate 15 firmly in place.

The final thickness of wafer holder 30 is due to the thickness of support structure 10 and ring 20. Typically this thickness is 1.2 mm (50 mils) to 3.5 mm (140 mils) which allows wafer holder 30 to be placed in the slots of most wafer cassettes used in the industry. The diameter of wafer holder 30 is only slightly larger than that of semiconductor substrate 15. This allows wafer holder 30 to be treated and handled like a traditional thick wafer. For example, if semiconductor substrate 15 is 75 mm (3 inches) in diameter, wafer holder 30 can be formed so that it has the shape of a wafer that is 100 mm (4 inches) in diameter. The outer portion of support structure 10 is formed with a flat 16 which is equal is size and proportion to a flat found on traditional 100 mm (4 inch wafers). Therefore, wafer holder 30 can be used in conjunction with industry standard wafer handling equipment such as vacuum wands and flat finders.

One method for using wafer holder 30 during an assembly process will now be provided. After semiconductor substrate 15 has been thinned down and is ready for electrical testing, semiconductor substrate 15 is aligned to alignment flat 14 and placed into support structure 10. Ring 20 is then placed on support structure 10 to hold semiconductor substrate 15. Wafer holder 30 can then be safely transported in a wafer cassette or a compact to a probe area. Using flat 16, wafer holder 30 is then aligned and placed onto a probe chuck. Once on the probe chuck, wafer holder 30 may be further aligned for higher accuracy. Vacuum pressure is then applied through vacuum openings 13 to ensure the top surface of semiconductor substrate 15 is planar. According to one embodiment, support structure 10 is formed from an electrically conductive material. This allows a bias or ground potential to be placed on the backside of semiconductor substrate 15. Semiconductor devices on the topside of semiconductor substrate 15 can then be probed through the opening in ring 20. After electrical testing, wafer holder 30 can be used to transport semiconductor substrate 15 to the next fabrication process, which may include wafer bonding or final assembly.

Figure 2:
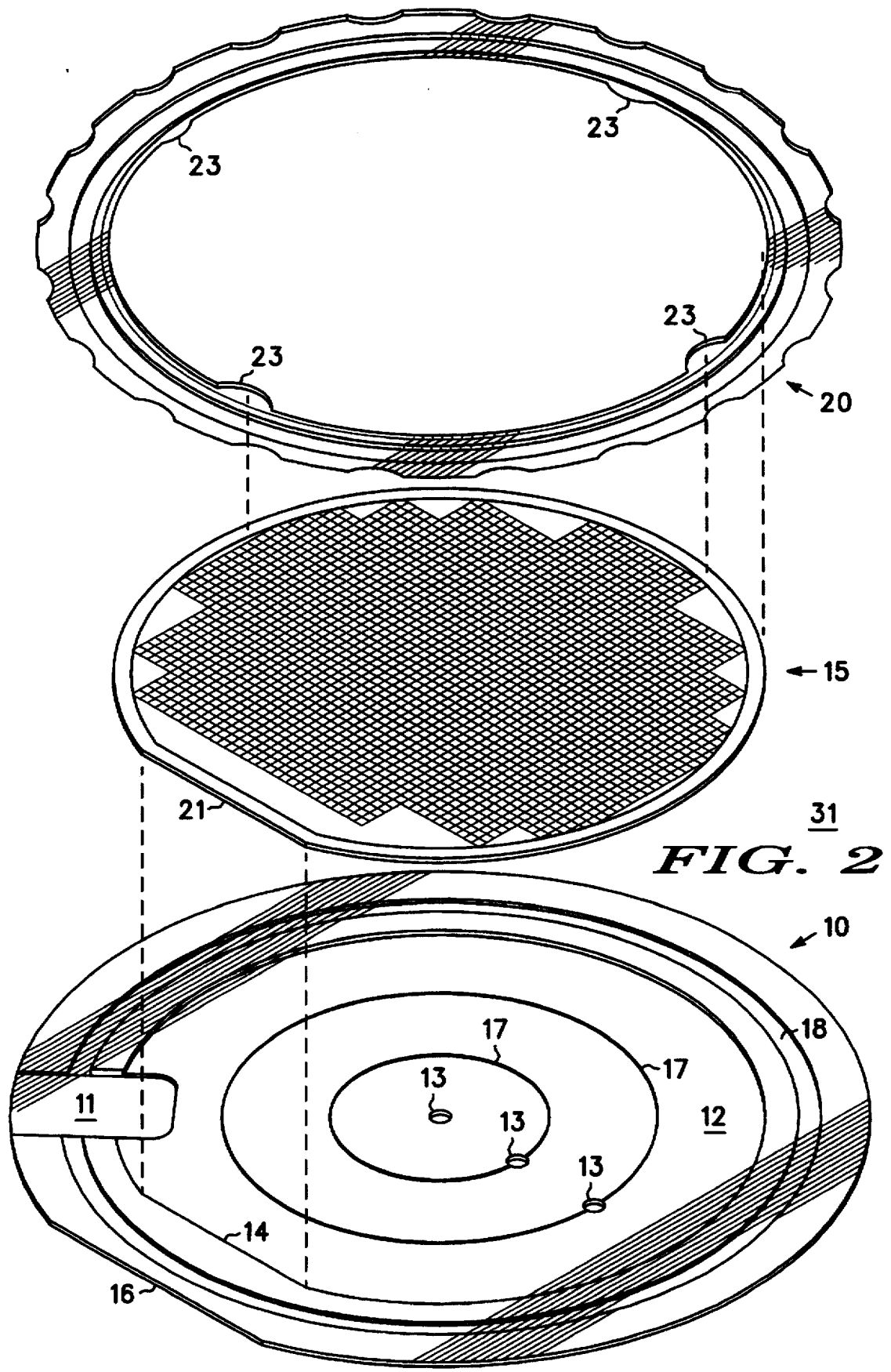
FIG. 2 is an enlarged isometric view of an apparatus according to an alternate embodiment of the present invention.

FIG. 2 is an enlarged isometric view of a wafer holder 31 according to an alternate embodiment of the present invention. Ring 20 can also be formed so that only a plurality of tabs 23 come in contact and hold semiconductor substrate 15 in place. Ring 20 exposes at least a central portion of semiconductor substrate 15 and is preferably formed from either "Delrin" or "Teflon".

By now it should be appreciated that the present invention provides a wafer holder 30 for the handling, transporting, or electrically testing of a thin semiconductor substrate 15. The thickness and shape of wafer holder 30 allow it to be used in conjunction with industry standard handling equipment. Support structure 10 can be formed from an electrically conductive material to apply a bias potential to semiconductor substrate 15 during electrical testing. Wafer holder 30 offers a significantly improved method for handling thin wafers which will reduce the number of wafers that are broken during transporting and probing operations due to improper wafer handling techniques.

We claim:

1. A wafer holder for semiconductor applications comprising:

a support structure having a patterned surface, a vacuum opening, and a vacuum wand slot extending into the support structure, the patterned surface having a recessed area and a vacuum groove intersecting the vacuum opening; and a ring that attaches to the support structure such that at least a portion of the ring is overlying at least a portion of the patterned surface of the support structure and at least a central portion of the support structure is exposed.

2. The wafer holder for semiconductor applications of claim 1, wherein the support structure and the ring have a combined thickness of 1.2 mm (50 mils) to 3.5 mm (140 mils).

3. The wafer holder for semiconductor applications of claim 1, wherein the support structure is formed from a material selected from the group consisting of aluminum, aluminum alloy, nickel, quartz, platinum, stainless steel, titanium, copper, and gold.

4. The wafer holder for semiconductor applications of claim 1, wherein the patterned surface of the support structure is plated with a material selected from the group consisting of aluminum, aluminum alloy, nickel, quartz, platinum, stainless steel, titanium, copper, and gold.

5. The wafer holder for semiconductor applications of claim 1, wherein the ring is formed from a material selected from the group consisting of "Delrin", "Teflon", aluminum, aluminum alloy, nickel, quartz, platinum, stainless steel, titanium, copper, and gold.

6. The wafer holder for semiconductor applications of claim 1, wherein the support structure has a flat.

7. A method for probing a semiconductor substrate comprising the steps of:

providing the semiconductor substrate;

placing the semiconductor substrate into a support structure, the support structure having at least one vacuum opening;

placing a ring on the support structure such that the semiconductor substrate is held in contact with the support structure;

applying a vacuum through the at least one vacuum opening of the support structure; and probing the semiconductor substrate.

8. The method for probing the semiconductor substrate of claim 7, further comprising the step of electrically testing a semiconductor device on the semiconductor substrate through an opening in the ring.

9. The method for probing the semiconductor substrate of claim 7, wherein the step of providing a semiconductor substrate includes providing a semiconductor substrate that has a thickness of 25 µm (1 mil) to 250 µm (10 mils).

10. The method for probing the semiconductor substrate of claim 7, wherein the step of placing the semiconductor substrate into the support structure further comprises placing the semiconductor substrate into support structure with a vacuum wand and removing the vacuum wand through a vacuum wand slot in the support structure.

11. The method for probing the semiconductor substrate of claim 7, wherein the step of placing the semiconductor substrate into the support structure includes aligning a flat on the semiconductor substrate to a flat on the support structure.

12. The method for probing the semiconductor substrate of claim 7, wherein the step of placing a ring on the support structure forms a wafer holder that is 1.2 mm to 3.5 mm thick.

13. A semiconductor wafer holder comprising a first portion and a second portion, the first portion having a recessed area for containing a semiconductor substrate and at least one vacuum opening to apply a vacuum to the semiconductor substrate, and the second portion attaches to the first portion to hold the semiconductor substrate in place and expose a portion of the semiconductor substrate.

14. The semiconductor wafer holder of claim 13, wherein the first portion and the second portion form a wafer holder that is 1.2 mm to 3.5 mm thick.

15. The semiconductor wafer holder of claim 13, wherein at least a portion of the first portion is plated with a material selected from the group consisting of aluminum, aluminum alloy, nickel, quartz, platinum, stainless steel, titanium, copper, and gold.

16. The semiconductor wafer holder of claim 13, wherein the first portion and the second portion are formed from materials selected from the group consisting of "Delrin", "Teflon", aluminum, aluminum alloy, nickel, quartz, platinum, stainless steel, titanium, copper, and gold.

17. The semiconductor wafer holder of claim 13, wherein the second portion further comprises a plurality of tabs used to hold the esmiconductor substrate.

* * * * *